(12) United States Patent
Nagasaka

(10) Patent No.: US 6,836,646 B2
(45) Date of Patent: Dec. 28, 2004

(54) CIRCUIT AND METHOD FOR COMPENSATING FOR NON-LINEAR DISTORTION

(75) Inventor: Hiroyuki Nagasaka, Yokohama (JP)

(73) Assignee: Samsung Electronics Co., Ltd (KR)

( * ) Notice: Subject to any disclaimer, the term of this patent is extended or adjusted under 35 U.S.C. 154(b) by 450 days.

(21) Appl. No.: 10/102,313

(22) Filed: Mar. 20, 2002

(65) Prior Publication Data

US 2002/0136324 A1 Sep. 26, 2002

(30) Foreign Application Priority Data

Mar. 22, 2001 (JP) ......................................... 2001-083715
Mar. 22, 2001 (JP) ......................................... 2001-083716

(51) Int. Cl.⁷ ............................ H04B 1/04; H04B 17/00
(52) U.S. Cl. ................ 455/126; 455/114.2; 455/114.3; 375/297; 330/149
(58) Field of Search ........................... 455/114.2, 114.3, 455/126, 67.13; 330/149; 375/296, 297

(56) References Cited

U.S. PATENT DOCUMENTS 5,404,378 A * 4/1995 Kimura ....................... 375/296
5,909,642 A * 6/1999 Suzuki .................... 455/114.3
6,384,677 B2 * 5/2002 Yamamoto ................... 330/10
6,437,644 B1 * 8/2002 Kenington ................... 330/149
6,552,609 B2 * 4/2003 Hamada et al. ............. 330/149
6,614,854 B1 * 9/2003 Chow et al. ................. 375/297
6,741,867 B1 * 5/2004 Tetsuya ....................... 455/522
6,751,447 B1 * 6/2004 Jin et al. .................. 455/114.3

FOREIGN PATENT DOCUMENTS

JP 2002-057733 * 1/2000 ........... H04L/27/36

* cited by examiner

*Primary Examiner*—Simon Nguyen
(74) *Attorney, Agent, or Firm*—Dilworth & Barrese LLP

(57) ABSTRACT

An apparatus for compensating for non-linear distortion generated during non-linear high-power amplification in a transmitter for non-linearly high-power amplifying a baseband signal by a high-power amplifier after quadrature modulation having a distortion extractor for extracting a non-linear distortion component from the non-linearly high-power amplified modulated signal. A quadrature modulator quadrature-modulates the non-linear distortion component into a baseband distortion component after phase adjustment. A distortion overlapping section overlaps the baseband signal with a phase-inverted distortion component of the baseband distortion component. A converter converts the non-linear distortion component output from the distortion extractor into a DC component. A controller automatically controls an attenuation of the output signal of the high-power amplifier to minimize the DC component output from the converter.

6 Claims, 13 Drawing Sheets

CIRCUIT AND METHOD FOR COMPENSATING FOR NON-LINEAR DISTORTION

PRIORITY

This application claims priority to an application entitled "Circuit and Method for Compensating for Non-linear Distortion" filed in the Japanese Patent Office on Mar. 22, 2001 and assigned Serial No. 2001-83715, and an application entitled "Circuit and Method for Compensating for Non-linear Distortion" filed in the Japanese Patent Office on Mar. 22, 2001 and assigned Serial No. 2001-83716, the contents of both of which are hereby incorporated by reference.

BACKGROUND OF THE INVENTION

1. Field of the Invention

The present invention relates generally to a quadrature modulation circuit used in a radio transmitter, and in particular, to an apparatus and method for compensating for non-linear distortion generated during high-power amplification after quadrature modulation of a baseband signal.

2. Description of the Related Art

A conventional quadrature (or orthogonal) modulation circuit quadrature-modulates a baseband signal and then high-power amplifies the modulated signal. The high-power amplified modulated signal is subject to non-linear amplification in order to improve power efficiency. This is because an amplification region of an amplifier is divided into a linear region and a non-linear region, and the high-power amplification is performed in the non-linear region. When amplified in the non-linear region, the amplified modulated signal suffers non-linear distortion. Thus, in order to linearize an input/output characteristic, it is necessary to compensate for distortion of the nonlinearly distorted signal. A typical, conventional non-linear distortion compensation circuit includes a predistortion-type non-linear distortion compensation circuit shown in FIG. 6.

A predistortion-type non-linear distortion compensation circuit will be described with reference to FIG. 6. Referring to FIG. 6, complex baseband signals I and Q are applied to a first D/A (Digital-to-Analog) converter 2 and a second D/A converter 3 through a distortion compensation operator 1. The first and second D/A converters 2 and 3 convert received digital signals to analog signals, and provide the converted analog signals to a quadrature modulator 4. The quadrature modulator 4 quadrature-modulates received baseband signals I and Q, and provides the quadrature-modulated signals to a high-power amplifier (HPA) 5. The high-power amplifier 5 then high-power amplifies the quadrature-modulated analog signals.

A compensation data table 7 stores compensation data in the form of a table. The compensation data stored in the compensation data table 7 is determined by previously measuring a non-linear characteristic of the high-power amplifier 5 during amplification. A power calculator 6 calculates power of the baseband signals I and Q, and provides the calculated power information to the compensation data table 7. The compensation data table 7 reads compensation data corresponding to the calculated power by consulting the table according to the power of the baseband signals I and Q, and then provides the read compensation data to the distortion compensation operator 1.

In this way, the distortion compensation operator 1 applies an inverse distortion component for canceling the non-linear distortion generated in the high-power amplifier 5 to the received baseband signals I and Q before quadrature modulation. The signals including the inverse distortion component for removing the non-linear distortion are provided to the first and second D/A converters 2 and 3. As a result, the non-linear distortion of the modulated signals amplified by the high-power amplifier 5 is reduced.

As stated above, the conventional predistortion-type non-linear distortion compensation circuit compensates for non-linear distortion through the use of the data table based on the power of the baseband signals, without considering a characteristic deviation of the high-power amplifier 5 and an effect of a variation of temperature has on the HPA 5. Therefore, overall performance of the circuit may be deteriorated due to the characteristic deviation of the high-power amplifier 5 and the temperature variation.

In an attempt to solve this problem, a directional combiner 8, as illustrated in FIG. 7, divides an output of the high-power amplifier 5 into two signals, and applies one of the divided signals to a quadrature demodulator 9. The quadrature demodulator 9 quadrature-demodulates the divided signal and feeds the demodulated divided signal back to a compensation data operator 10. The compensation data operator 10 multiplies a coefficient based on the feedback information by data read from an internal compensation data table (though not shown, it is equal to the compensation data table 7 of FIG. 6). As a result, the compensation data operator 10 provides the distortion compensation operator 1 with compensated data having greater accuracy regardless of the characteristic deviation of the high-power amplifier 5 and the temperature variation.

However, since the elements 8–10 of FIG. 7 generate pseudo non-linear distortion themselves, it is not possible to completely resolve the problem. In addition, all these elements perform a complicated digital operation, resulting in an increase in the circuit size and cost. Further, the increase in the circuit size increases power consumption, causing a reduction in a batter-run time of a mobile communication terminal that uses a battery as a power source.

In a further attempt to solve this problem, the applicant has proposed a nonlinear distortion compensation circuit of FIG. 5, disclosed in Japanese patent application No. 2000-233631, the contents of which are hereby incorporated by reference. The nonlinear distortion compensation circuit includes directional combiners/dividers 19 and 21, a delay circuit/phase shifter 20, an attenuator 13, a subtracter 14, a quadrature modulator 11, a quadrature demodulator 15, a phase adjuster 22, amplitude adjusters 23 and 24, and subtracters 16 and 17.

The non-linear distortion compensation circuit interposes the directional combiner/divider 19 between the quadrature modulator 11 and a high-power amplifier 12. The directional combiner/divider 19 divides a modulated signal provided from the quadrature modulator 11 into two signals, and provides one of the divided modulated signals to the delay circuit/phase shifter 20 and provides the other divided modulated signal to the high-power amplifier 12. The delay circuit/phase shifter 20 then shifts the phase of the received signal to match it to the phase of an output signal of the attenuator 13, and then provides the phase-shifted signal to the subtracter 14. Also, the directional combiner/divider 21 divides the output of the high-power amplifier 12 into two signals, and provides one of the divides signals to the attenuator 13. The subtracter 14 calculates a difference between the signal from the delay circuit/phase shifter 20 and the signal from the attenuator 13, and provides the difference to the phase adjuster 22. The non-linear distortion component calculated by the subtracter 14 is phase-adjusted through the phase adjuster 22, and then provided to the quadrature demodulator 15. Baseband non-linear distortion components output from the quadrature demodulator 15 are amplitude-adjusted to a proper level through the amplitude adjusters 23 and 24, and then provided to the subtracters 16 and 17. A non-linear distortion extractor 1A for extracting the non-linear distortion component from the non-linearly high-power amplified modulated signal is comprised of the directional combiners/dividers 19 and 21, the delay circuit/phase shifter 20, the attenuator 13 and the subtracter 14.

However, this conventional distortion compensation circuit controls the delay circuit/phase delay 20 and the attenuator 13 on the basis of the point in time when the high-power amplifier 12 has its maximum output power where the non-linear distortion is most significant. Therefore, a reference distortion compensation control point is fixed to the point where the high-power amplifier 12 has its maximum output power where the non-linear distortion is most significant. Thus, the subtracter 14 outputs the nonlinear distortion component with highest precision at the fixed reference control point where a distortion-free signal is minimized. Though an adjacent channel power ratio (ACPR) is not considerably deteriorated even at the non-maximum output power as compared with at the maximum output power, the control point may be slightly deviated, resulting in deterioration of the system performance. In addition, a subtle change in the non-linear characteristic of the high-power amplifier 12 due to a variation in the time and the ambient temperature may deviate an optimal control point.

Further, as illustrated in FIG. 8, an input power-to-ACPR characteristic of the high-power amplifier 12 in the non-linear distortion compensation circuit is greatly deteriorated when the distortion compensation is continuously performed as compared with when the distortion compensation is suspended at a specific input power level. The reasons are as follows. The non-linear distortion compensation circuit controls the delay circuit/phase shifter 20 and the attenuator 13 at the point when the high-power amplifier 12 has its maximum output power where the non-linear distortion is most considerable, and fixedly sets a point a showing the non-linear distortion component with the highest accuracy, where the distortion-free signal is minimized, as the control point of the delay circuit/phase shifter 20 and the attenuator 13. Accordingly, a change in the output power of the high-power amplifier 12 may cause deviation of the control point, so that the subtracter 14 cannot completely remove the distortion-free signal. That is, the signal at the output node a of the subtracter 14 includes the distortion-free signal, which is an output signal of the transmitter, as well as the non-linear distortion component.

As a result, when the input power level of the high-power amplifier 12 is lower than a predetermined level, even the desired distortion-free signal component is fed back to the quadrature modulator 11. The feedback of the desired distortion-free signal component causes a decrease in a level of the desired distortion-free signal component, resulting in a reduction in the ACPR.

SUMMARY OF THE INVENTION

Therefore, it is an object of the present invention to provide a non-linear distortion compensation circuit and method for extracting non-linear distortion with high accuracy regardless of a variation of the time and the ambient temperature in a high-power amplifier.

It is another object of the present invention to provide a non-linear distortion compensation circuit and method for providing an excellent ACPR characteristic over the whole input power level of a high-power amplifier.

In accordance with one embodiment of the present invention, there is provided a method for compensating for non-linear distortion generated during non-linear high-power amplification in a transmitter after quadrature modulation, the transmitter including a distortion extractor for extracting a non-linear distortion component from a non-linearly high-power amplified modulated signal, a quadrature modulator for quadrature modulating the non-linear distortion component into a baseband distortion component after phase adjustment, and a distortion overlapping section for overlapping the baseband signal with a phase-inverted distortion component of the baseband distortion component. The method comprises attenuating an output signal of the high-power amplifier by a gain of the high-power amplifier when the high-power amplifier generates an amplified signal, and extracting only a non-linear distortion component by subtracting a phase-adjusted input signal of the high-power amplifier from the attenuated signal, converting the non-linear distortion component into a DC component, and automatically controlling an attenuation of the output signal of the high-power amplifier so that the DC component becomes minimized.

In accordance with another embodiment of the present invention, there is provided a circuit for compensating for non-linear distortion generated during nonlinear high-power amplification in a transmitter after quadrature modulation, the transmitter including a distortion extractor for extracting a non-linear distortion component from a non-linearly high-power amplified modulated signal, a quadrature modulator for quadrature modulating the non-linear distortion component into a baseband distortion component after phase adjustment, and a distortion overlapping section for overlapping the baseband signal with a phase-inverted distortion component of the baseband distortion component. The circuit comprises a converter for converting the non-linear distortion component output from the distortion extractor into a DC component; and a controller for automatically controlling an attenuation of the output signal of the high-power amplifier so that the DC component output from the converter becomes minimized.

The distortion extractor comprises an attenuator for attenuating the output signal of the high-power amplifier by a gain of the high-power amplifier, when the high-power amplifier outputs an amplified signal; a phase adjuster for adjusting a phase of an input signal of the high-power amplifier; and a subtracter for subtracting an output signal of the phase adjuster from an output signal of the attenuator. The attenuator, under the control of the controller, automatically controls an attenuation of the output signal of the high-power amplifier such that the DC component output from the converter becomes minimized.

In accordance with a further embodiment of the present invention, there is provided a method for compensating for non-linear distortion generated during non-linear high-power amplification in a transmitter after quadrature modulation, the transmitter including a distortion extractor for extracting a non-linear distortion component from a non-linearly high-power amplified modulated signal, a quadrature modulator for quadrature modulating the non-linear distortion component into a baseband distortion component after phase adjustment, and a distortion overlapping section for overlapping the baseband signal with a phase-inverted distortion component of the baseband distortion component. The method comprises suspending an operation of overlapping the baseband signal with a phase-inversed distortion component of the baseband distortion component, when an input power level of the high-power amplifier drops below a power level at a point where an input power-to-ACPR characteristic of the high-power amplifier becomes worse during non-linear distortion compensation control than during suspension of the non-linear distortion compensation control.

In accordance with yet another embodiment of the present invention, there is provided a circuit for compensating for non-linear distortion generated during non-linear high-power amplification in a transmitter after quadrature modulation, the transmitter including a distortion extractor for extracting a non-linear distortion component from a non-linearly high-power amplified modulated signal, a quadrature modulator for quadrature modulating the non-linear distortion component into a baseband distortion component after phase adjustment, and a distortion overlapping section for overlapping the baseband signal with a phase-inverted distortion component of the baseband distortion component. The circuit comprises a switch for switching an input signal, included in a feedback loop formed between the distortion extractor and the distortion overlapping section; a power detector for detecting an input power level of the high-power amplifier; a controller for receiving the signal detected by the power detector and turning off the switch when the input power level of the high-power amplifier drops below a power level at a point where an input power-to-ACPR characteristic of the high-power amplifier becomes worse during non-linear distortion compensation control than during suspension of the non-linear distortion compensation control.

In accordance with still another embodiment of the present invention, there is provided a circuit for compensating for non-linear distortion generated during non-linear high-power amplification in a transmitter for non-linearly high-power amplifying a baseband signal by a high-power amplifier after quadrature modulation, the transmitter including a distortion extractor for extracting a non-linear distortion component from the non-linearly high-power amplified modulated signal, a quadrature modulator for quadrature modulating the non-linear distortion component into a baseband distortion component after phase adjustment, and a distortion overlapping section for overlapping the baseband signal with a phase-inverted distortion component of the baseband distortion component. The circuit comprises a power detector for detecting an input power level of the high-power amplifier; and a controller for receiving the signal detected by the power detector and disabling one of a plurality of function elements included in a feedback loop formed between the distortion extractor and the distortion overlapping section, when the input power level of the high-power amplifier drops below a power level at a point where an input power-to-ACPR characteristic of the high-power amplifier becomes worse during non-linear distortion compensation control than during suspension of the non-linear distortion compensation control.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENT

Preferred embodiments of the present invention will be described herein below with reference to the accompanying drawings. In the following description, well-known functions or constructions are not described in detail since they would obscure the invention in unnecessary detail.

Figure 1:
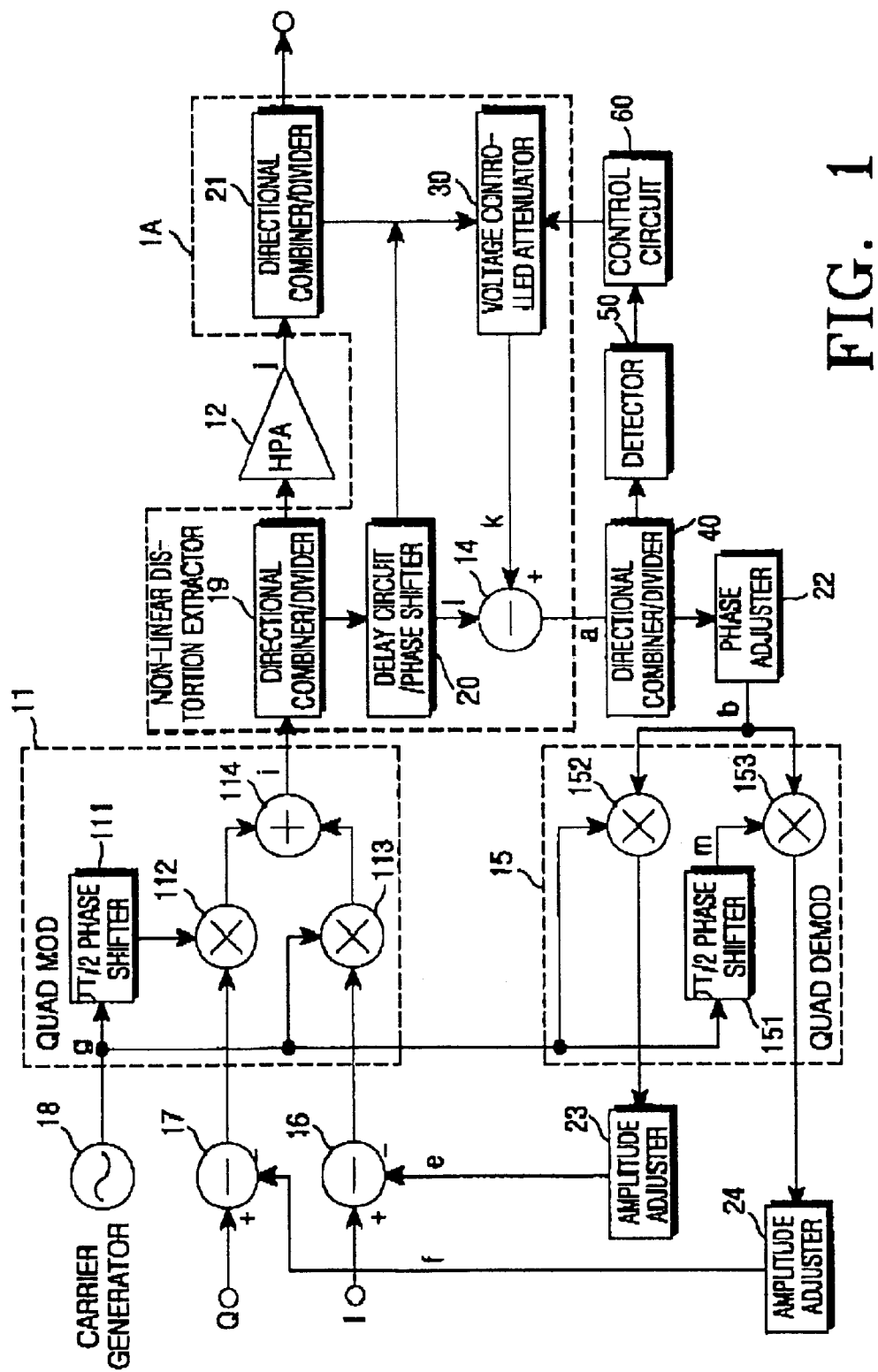
FIG. 1 illustrates a structure of a non-linear distortion compensation circuit according to a first embodiment of the present invention.

FIG. 1 illustrates a structure of a non-linear distortion compensation circuit according to a first embodiment of the present invention.

Figure 5:
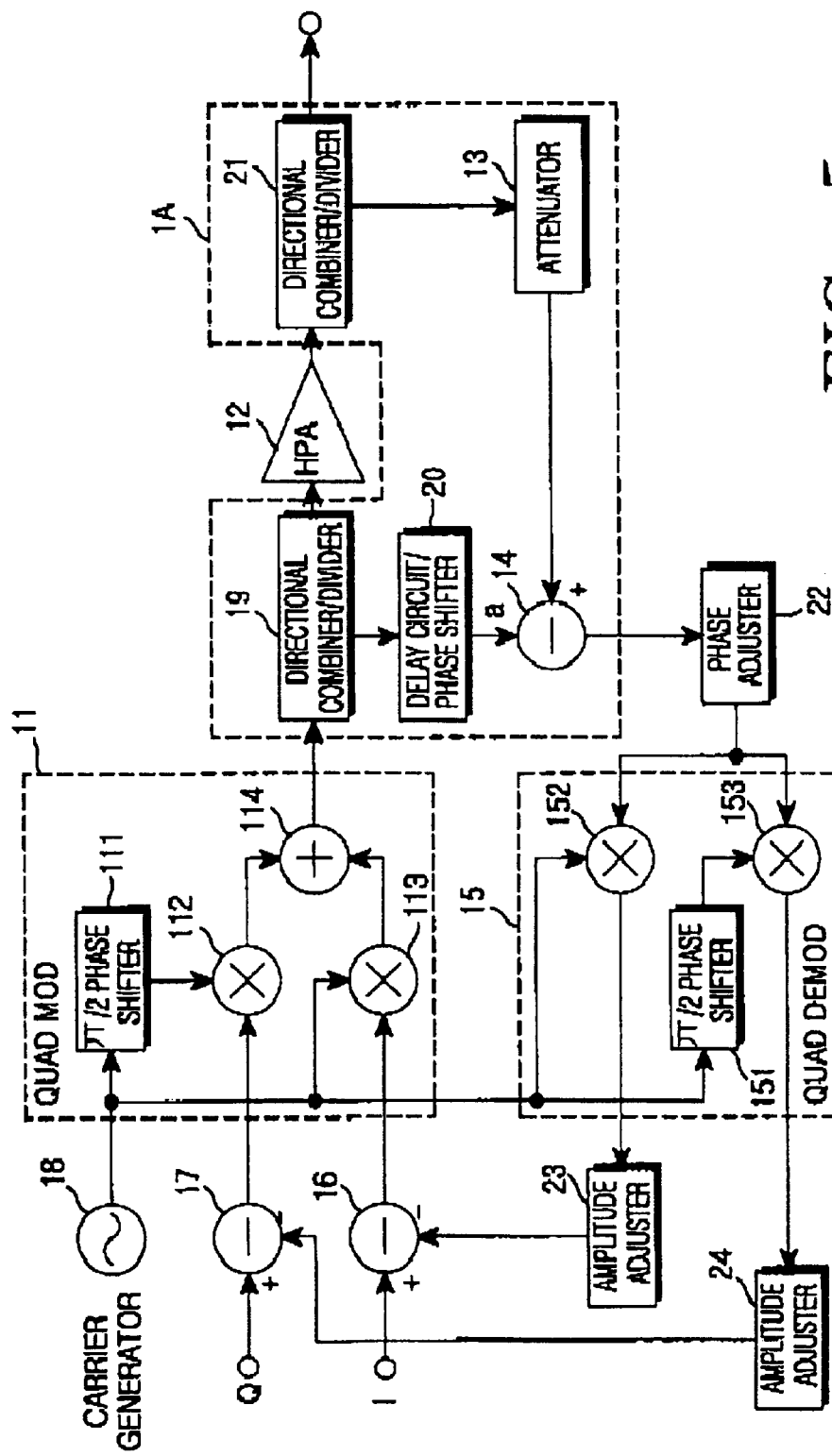
FIG. 5 illustrates a structure of a conventional non-linear distortion compensation circuit.
Figure 6:
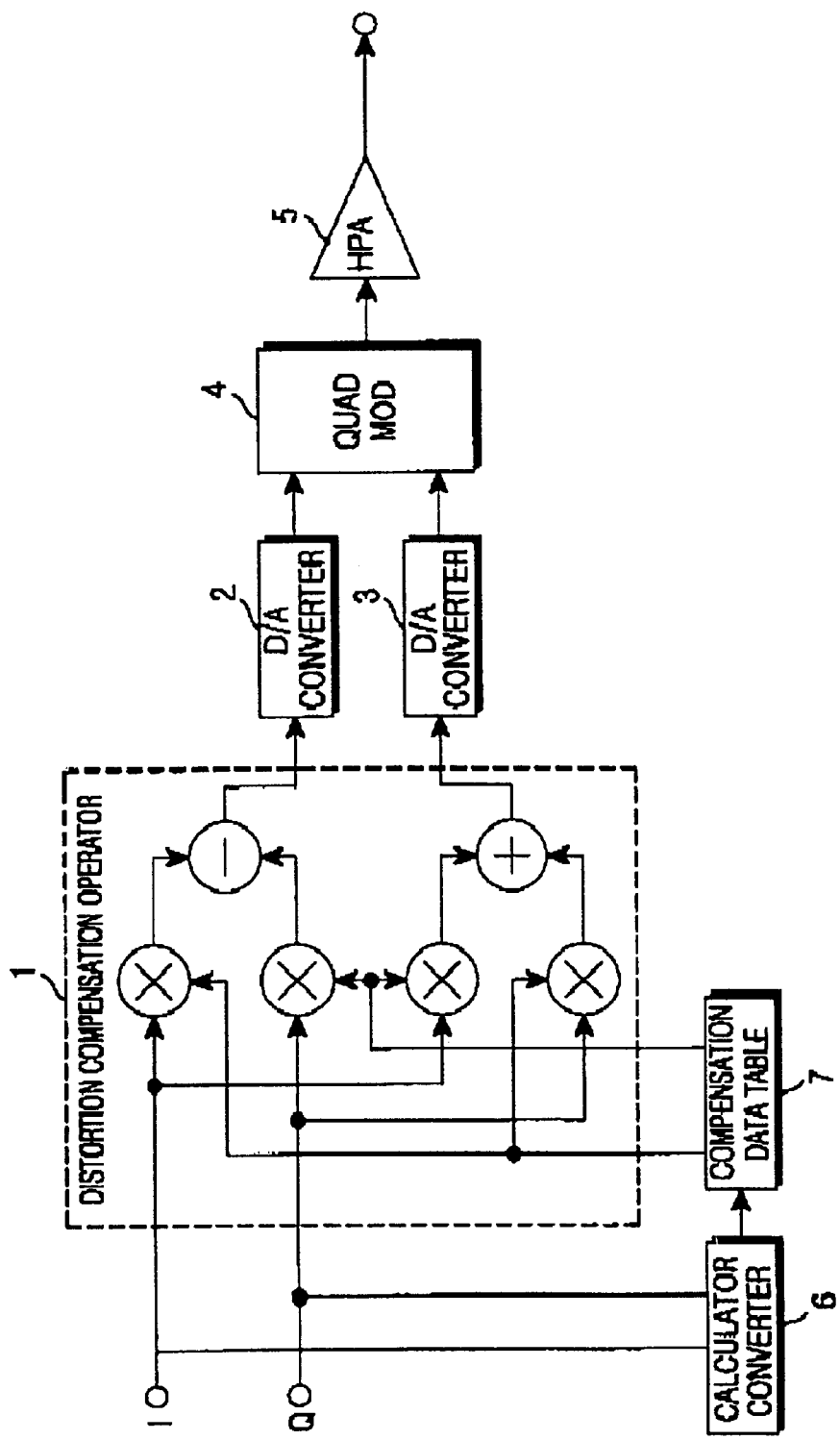
FIG. 6 illustrates a structure of a conventional non-linear distortion compensation circuit.
Figure 7:
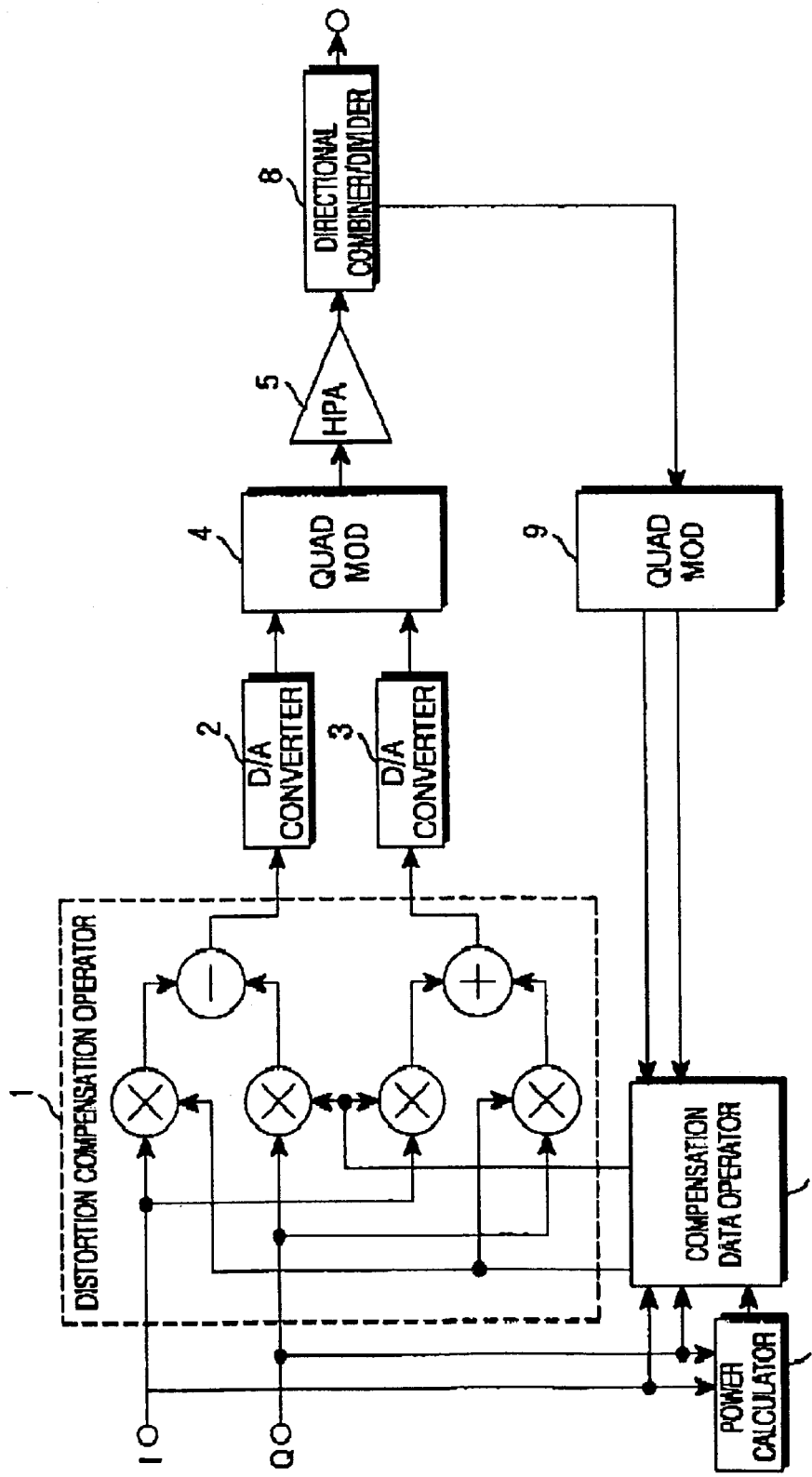
FIG. 7 illustrates a structure of another conventional non-linear distortion compensation circuit.

A structure and operation of the non-linear distortion compensation circuit will be described herein below. First, reference will be made to the differences between the conventional non-linear distortion compensation circuit of FIG. 5 and the novel non-linear distortion compensation circuit of FIG. 1. The novel non-linear distortion compensation circuit includes an electrically controllable voltage controlled attenuator 30 instead of the attenuator 13 in the non-linear distortion extractor 1A. Further, the non-linear distortion compensation circuit includes a directional combiner/divider 40 for dividing an output signal of subtracter 14 into two signals. One of the divided signals from the directional combiner/divider 40 is provided to the phase adjuster 22, while the other divided signal is provided to a detector 50. The detector 50 converts the received non-linear distortion component signal into a DC (Direct Current) component, and provides the DC component to a control circuit 60. Based on the output signal of the detector 50, the control circuit 60 generates a control signal for automatically controlling an attenuation of the output signal of the high-power amplifier 12 such that the DC component output from the detector 50 becomes minimized. The control circuit 60 provides the generated control signal to the voltage controlled attenuator 30 to control an attenuation of the voltage controlled attenuator 30. The other structure is identical to that of FIG. 5, so a detailed description will be avoided herein, for simplicity.

Figure 2:
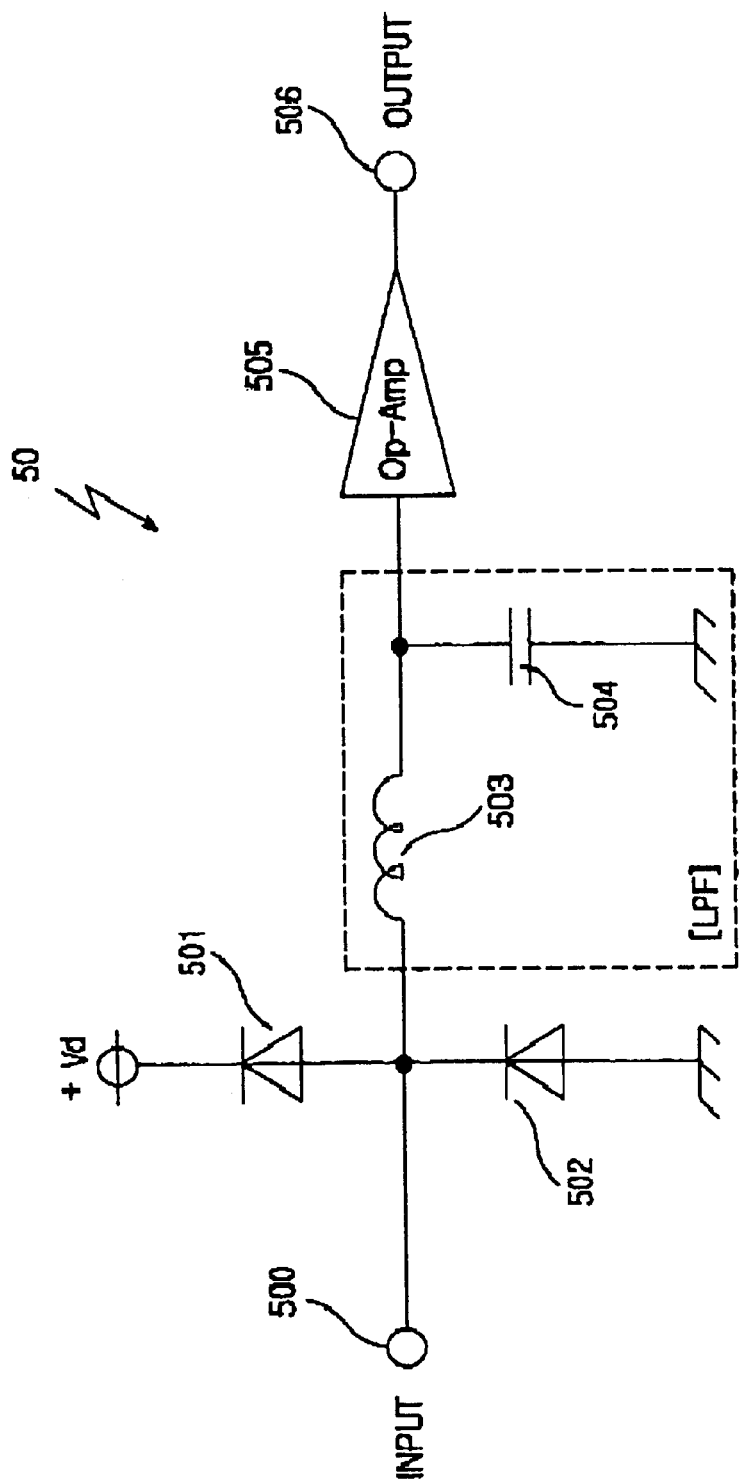
FIG. 2 illustrates a detailed structure of the detector of FIG. 1.

FIG. 2 illustrates a detailed structure of the detector of FIG. 1. Referring to FIG. 2, the detector 50 includes a rectifier comprised of diodes 501 and 502 for rectifying a non-linear distortion component, a lowpass filter comprised of an inductor 503 and a capacitor 504, and an operational amplifier 505 for DC-amplifying an output of the lowpass filter and providing its output to the control circuit 60.

Figure 3:
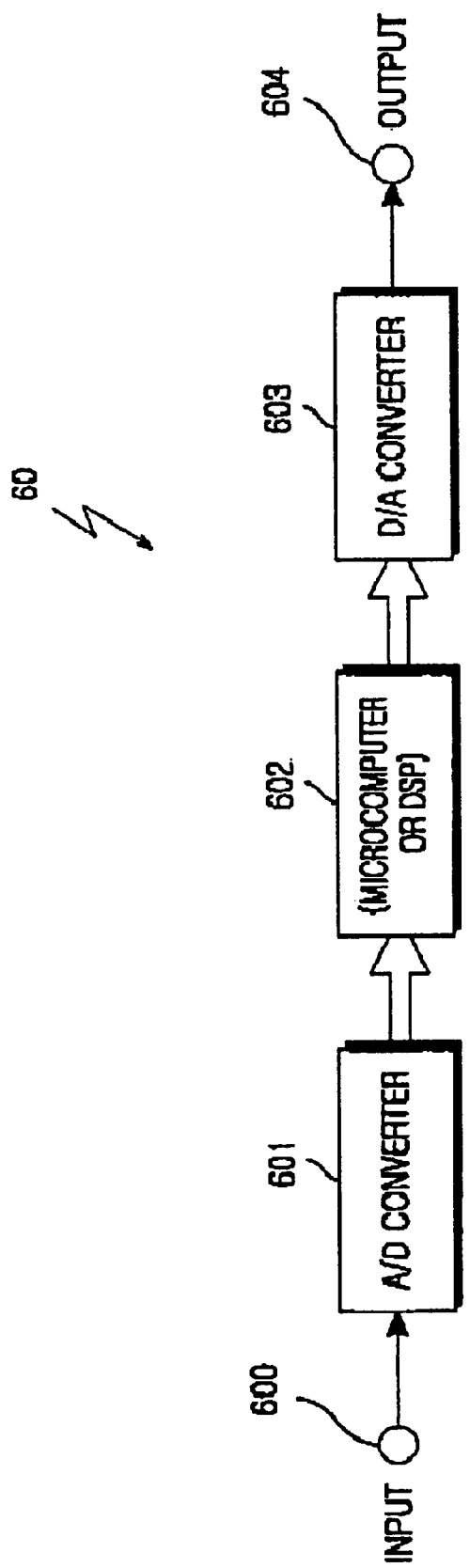
FIG. 3 illustrates a detailed structure of the control circuit of FIG. 1.

FIG. 3 illustrates a detailed structure of the control circuit of FIG. 1. Referring to FIG. 3, the control circuit 60 includes an analog-to-digital (A/D) converter 601, a microcomputer (or digital signal processor (DSP)) 602, and a D/A converter 603. The A/D converter 601 converts a DC signal output from the detector 50 to a digital signal. Based on the output of the A/D converter 601, the microcomputer 602 calculates a control signal for controlling the voltage controlled attenuator 30 so that the output of the detector 50 becomes minimized. The D/A converter 603 converts an output of the microcomputer 602 to an analog signal.

Next, an operation of the non-linear distortion compensation circuit of FIG. 1 will be described in detail herein below. The description will be made on the assumption that a phase delay of the delay circuit/phase shifter 20 and an attenuation of the voltage controlled attenuator 30 are previously set such that the subtracter 14 extracts an optimal non-linear distortion component generated during non-linear high-power amplification according to a transmission frequency. In this state, the control circuit 60 need not control the voltage controlled attenuator 30.

The subtracters 16 and 17 subtract distortion components e and f from baseband signals I and Q, respectively, and then provide the subtracted signals to the quadrature modulator 11. Further, the quadrature modulator 11 is provided with a carrier signal g generated by the carrier generator 18. The multiplier 112 then multiplies the $\pi/2$-phase-shifted carrier from the $\pi/2$ phase shifter 111 by a signal determined by subtracting the signal f from the baseband signal Q by the subtracter 17, and provides its output to the adder 114. At the same time, the multiplier 113 in the quadrature modulator 11 multiplies the carrier g from the carrier generator 18 by a signal determined by subtracting the signal e from the baseband signal I by the subtracter 16, and provides its output to the adder 114. The adder 114 then adds the output signal of the multiplier 112 and the output signal of the multiplier 113, thus outputting a quadrature-modulated signal i. The quadrature-modulated signal i is divided into two signals by the directional combiner/divider 19: one of the divided signals is provided to the high-power amplifier 12, while the other divided signal is provided to the delay circuit/phase shifter 20.

The high-power amplifier 12 non-linearly high-power amplifies the quadrature-modulated signal by a gain of K. An output signal j of the high-power amplifier 12 is divided again into two signals by the directional combiner/divider 21: one of the divided signals is provided as an output signal, while the other divided signal is provided to the voltage controlled attenuator 30. The voltage controlled attenuator 30 attenuates the signal by the gain of the high-power amplifier 12. An output signal k of the voltage controlled attenuator 30 is provided to the subtracter 14.

Meanwhile, the delay circuit/phase shifter 20 properly shifts a phase of the divided signal in order to match it to a phase of the output signal of the voltage controlled attenuator 30, and provides its output signal l to the subtracter 14.

The subtracter 14 then subtracts the output signal l of the delay circuit/phase delay 20 from the output signal k of the voltage controlled attenuator 30. That is, the subtracter 14 subtracts the distortion-free quadrature-modulated signal l output through the directional combiner/divider 19 and the delay circuit/phase shifter 20, from the distortion component-included signal k output through the high-power amplifier 12, the directional combiner/divider 21 and the voltage controlled attenuator 30. By doing so, the subtracter 14 extracts only the non-linearly amplified distortion component a.

The non-linearly amplified distortion component a is divided into two signals by the directional combiner/divider 40: one of the divided signals is provided to the phase adjuster 22 and the other divided signal is provided to the detector 50. The phase adjuster 22 adjusts a phase of the divided signal from the directional combiner/divider 40, and provides the phase-adjusted signal to the multipliers 152 and 153 in the quadrature demodulator 15.

Further, the quadrature demodulator 15 receives the carrier signal g generated by the carrier generator 18. The multiplier 152 in the quadrature demodulator 15 multiplies the non-linear distortion component b output from the phase adjuster 22 by a carrier signal g and provides its output to the amplitude adjuster 23. Further, the $\pi/2$ phase shifter 151 in the quadrature demodulator 15 shifts a phase of the carrier signal g by $\pi/2$, and provides the phase-shifted carrier m to the multiplier 153. The multiplier 153 then multiplies the phase-shifted carrier m by the non-linear distortion component b output from the phase adjuster 22 and provides its output to the amplitude adjuster 24. In this manner, the non-linear distortion component b is subject to quadrature demodulation. The amplitude adjusters 23 and 24 adjust amplitude of the received signals and provide the amplitude-adjusted baseband distortion components e and f to the subtracters 16 and 17, respectively.

As a result, the subtracter 16 provides the baseband signal I overlapped with an inverse distortion component to the quadrature modulator 11 by previously subtracting the distortion component e caused by the amplification operation of the high-power amplifier 12 from the baseband signal I. Also, the subtracter 17 provides the quadrature modulator 11 with the baseband signal Q overlapped with the inverse distortion component by previously subtracting the distortion component f caused by the amplification operation of the high-power amplifier 12 from the baseband signal Q. That is, the subtracters 16 and 17 overlap the input baseband signals with the distortion components having an inverse baseband distortion characteristic caused by quadrature demodulation of the distortion components extracted by the subtracter 14, i.e., a characteristic of removing the non-linear distortion components generated during high-power amplification. Thus, it is possible to remove the non-linear distortion components generated during high-power amplification by the high-power amplifier 12 after quadrature-modulation of the inverse distortion component-overlapped baseband signals by the quadrature modulator 11.

Figure 4:
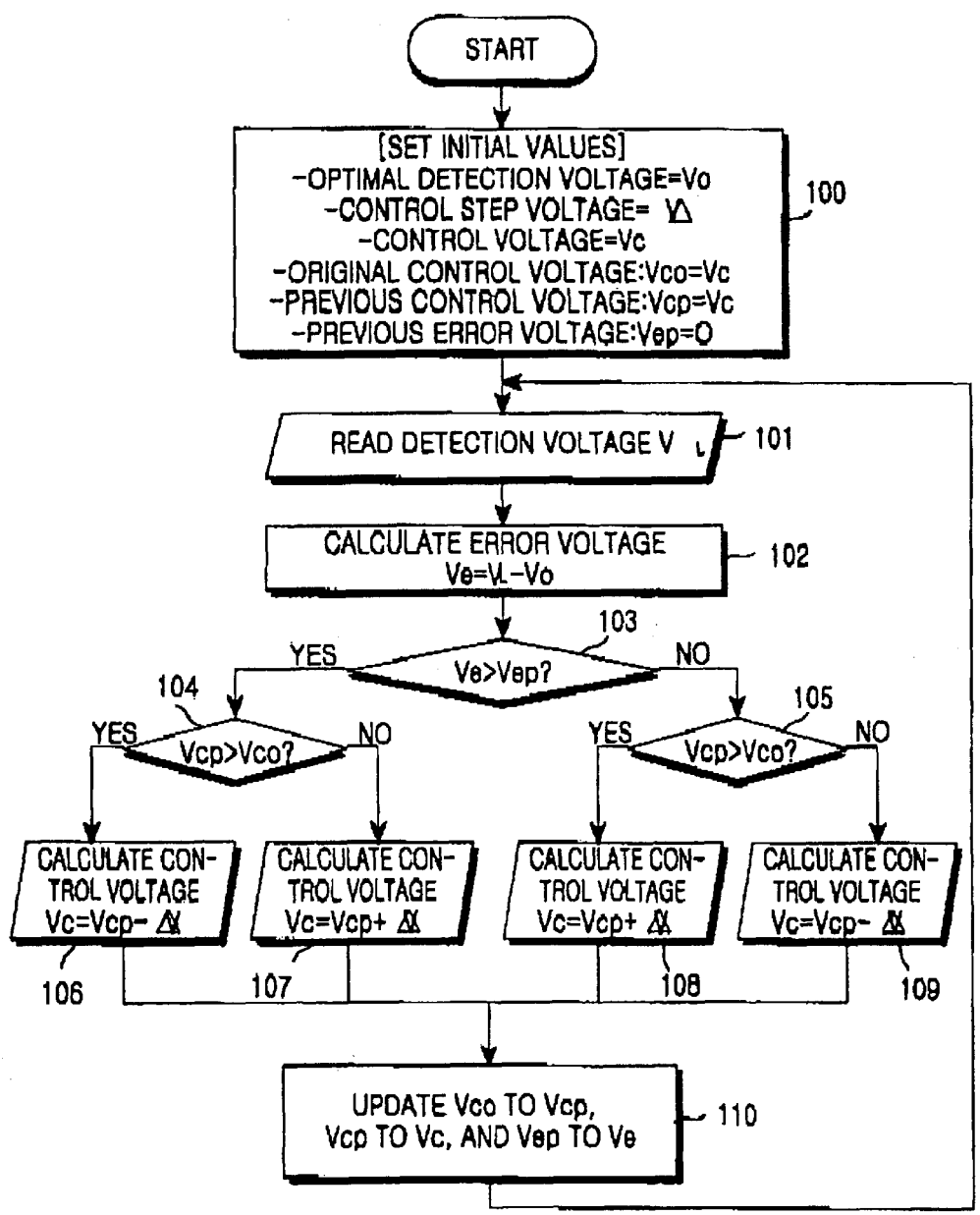
FIG. 4 illustrates a control operation of the control circuit of FIG. 1.

Next, with reference to FIG. 4, a description will be made as to how the control circuit 60 operates when the non-linear distortion characteristic of the high-power amplifier 12 varies according to a variation in the ambient temperatures. In step 100, the control circuit 60 sets initial values for outputting the pure non-linear distortion component with high accuracy, caused by the non-linear amplification of the high-power amplifier 12, at the subtracter 14. To be specific, a detection voltage output from the detector 50, optimized by the delay circuit/phase shifter 20 and the voltage controlled attenuator 30, is set to Vo. A current control voltage provided from the control circuit 60 to the voltage controlled attenuator 30 is set to Vc. An original control voltage (or previous control voltage before last) provided from the control circuit 60 to the voltage controlled attenuator 30 is set to Vco, and a previous control voltage provided from the control circuit 60 to the voltage controlled attenuator 30 is set to Vcp. An error voltage output from the detector 50 is set to Ve, and a previous error voltage of the detector 50 is set to Vep. A control step voltage, a variable value of the control voltage provided from the control circuit 60 to the voltage controlled attenuator 30, is set to $\Delta V$ (where $\Delta V > 0$). In the initial state, Vco=Vc, Vcp=Vc and Vep=0. The initialized voltage values are stored in an internal memory of the control circuit 60. Here, the error voltage Ve refers to a voltage difference between a current output voltage of the detector 50 and a reference output voltage of the detector 50, determined when the subtracter 14 outputs the pure non-linear distortion component.

In step 101, the control circuit 60 reads a detection voltage $V_L$, an output of the detector 50. Thereafter, in step 102, the control circuit 60 calculates an error voltage Ve ($=V_L-V_O$) of the voltage detector 50. The control circuit 60 determines in step 103 whether the error voltage Ve of the detector 50 is higher than a previous error voltage Vep, i.e., whether the current error voltage is higher than the previous error voltage. If the current error voltage is higher than the previous error voltage, i.e., if the performance has been deteriorated, the control circuit 60 proceeds to step 104. However, if the current error voltage is not higher than the previous error voltage, i.e., if the performance has been improved, the control circuit 60 proceeds to step 105.

In step 104, the control circuit 60 determines whether the previous control voltage Vcp provided from the control circuit 60 to the voltage controlled attenuator 30 is higher than the original control voltage (or a control voltage from a prior cycle) Vco provided from the control circuit 60 to the voltage controlled attenuator 30. If the previous control voltage Vcp is higher than the original control voltage Vco, the control circuit 60 calculates the control voltage Vc ($=$Vcp$-\Delta V$) provided to the voltage controlled attenuator 30 in step 106. Otherwise, if the previous control voltage Vcp is not higher than the original control voltage Vco, the control circuit 60 calculates the control voltage Vc ($=$Vcp$+\Delta V$) provided to the voltage controlled attenuator 30 in step 107.

In step 105, the control circuit 60 determines whether the previous control voltage Vcp provided from the control circuit 60 to the voltage controlled attenuator 30 is higher than the original control voltage (or previous control voltage before last) Vco provided from the control circuit 60 to the voltage controlled attenuator 30. If the previous control voltage Vcp is higher than the original control voltage Vco, the control circuit 60 calculates the control voltage Vc ($=$Vcp$+\Delta V$) provided to the voltage controlled attenuator 30 in step 108. Otherwise, if the previous control voltage Vcp is not higher than the original control voltage Vco, the control circuit 60 calculates the control voltage Vc ($=$Vcp$-\Delta V$) provided to the voltage controlled attenuator 30 in step 109.

In step 110, the control circuit 60 updates the original control voltage Vco to Vcp, the previous control voltage Vcp to Vc, and the previous error voltage Vep to Ve, (Vco=Vcp, Vcp=Vc and Vep=Ve). Thereafter, the control circuit 60 returns to step 101 and repeats the above process.

Since the above-stated process is performed according to the output voltage level of the detector 50, the control circuit 60 performs a control operation such that the output voltage of the detector 50 must be minimized. Namely, the control circuit 60 automatically controls the subtracter 14 such that it outputs the pure non-linear distortion component.

The non-linear distortion compensation circuit according to the present invention attenuates an output signal of the high-power amplifier 12 by a gain of the high-power amplifier 12, when the high-power amplifier 12 outputs an amplified signal. Thereafter, the non-linear distortion compensation circuit extracts the pure non-linear distortion component by subtracting a phase-adjusted input signal to the high-power amplifier 12 from the attenuated signal, and then converts the extracted non-linear distortion component to a DC component. That is, the non-linear distortion compensation circuit automatically controls an attenuation of the output signal of the high-power amplifier 12 so that the DC component is minimized, thus making it possible to extract the pure non-linear distortion component with high accuracy regardless of a variation in the time and the ambient temperature.

Therefore, the nonlinear distortion compensation circuit can perform the best non-linear distortion compensation function, even though the non-linear distortion characteristic of the high-power amplifier 12 is changed due to a variation in its output power or a variation in the time and the ambient temperature.

Figure 9:
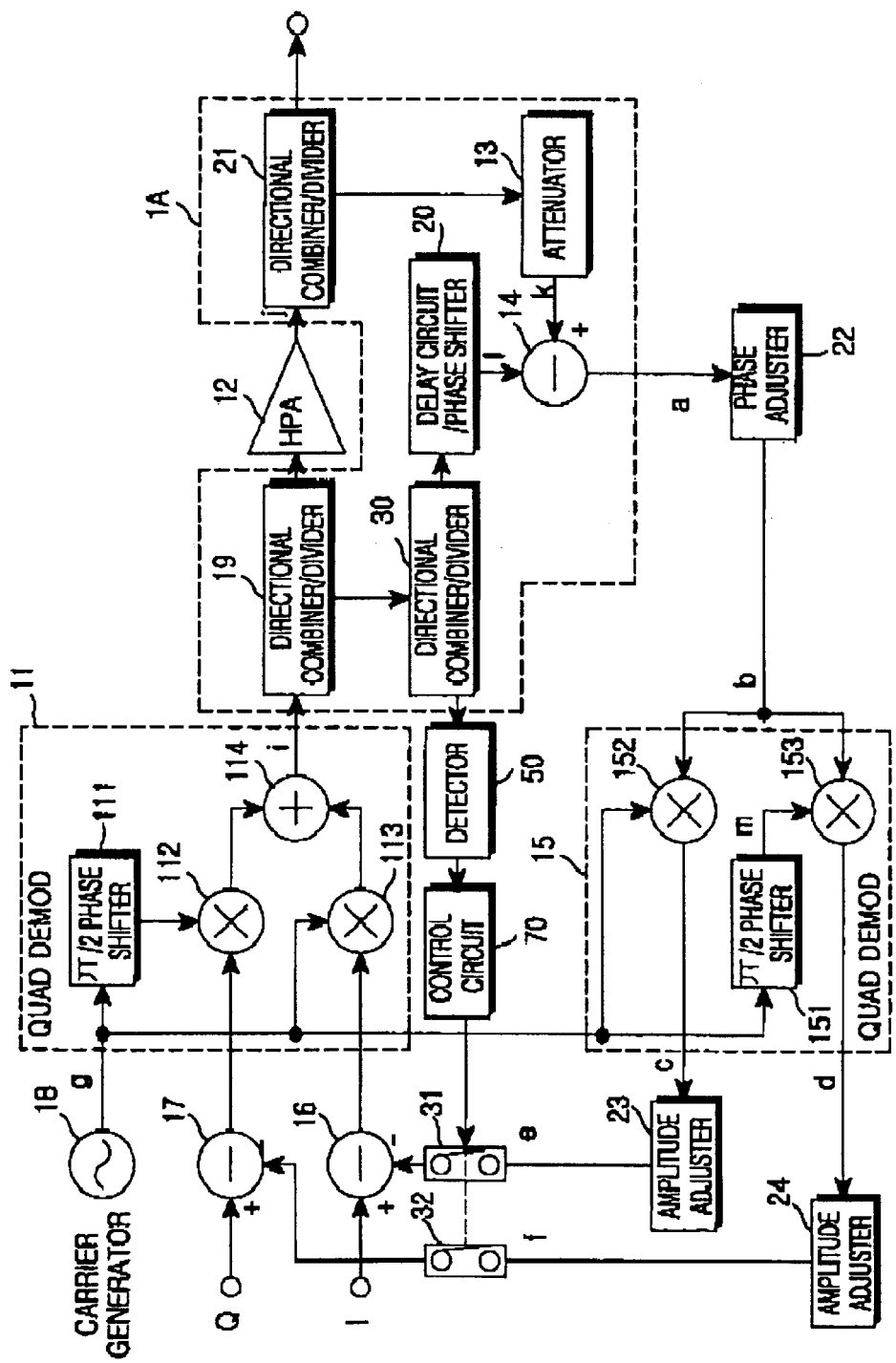
FIG. 9 illustrates a non-linear distortion compensation circuit according to a second embodiment of the present invention.

FIG. 9 illustrates a non-linear distortion compensation circuit according to a second embodiment of the present invention. Reference will first be made to the differences between the non-linear distortion compensation circuit according this second embodiment of the present invention and the conventional non-linear distortion compensation circuit of FIG. 5. The non-linear distortion compensation circuit according to the second embodiment of the present invention interposes a directional combiner/divider 30 between the directional combiner/divider 19 and the delay circuit/phase shifter 20 in the non-linear distortion extractor 1A. Further, the non-linear distortion compensation circuit includes an electrically controllable switch 31 interposed between the amplitude adjuster 23 and the subtracter 16, and an electrically controllable switch 32 interposed between the amplitude adjuster 24 and the subtracter 17. In addition, the non-linear distortion compensation circuit includes a detector 50 and a control circuit 70 connected between one output node of the directional combiner/divider 30 and the switches 31 and 32. Another output node of the directional combiner/divider 30 is connected to the delay circuit/phase shifter 20. Therefore, one divided signal output from the directional combiner/divider 30 is provided to the detector 50, and the control circuit 70 controls the switches 31 and 32 based on the output of the detector 50. The other structure is identical to that of FIG. 5, so the detailed description will be avoided herein, for simplicity.

The switches 31 and 32, interlinked with each other, are simultaneously turned ON or OFF by the control circuit 70. The switches 31 and 32 are turned ON in a normal state. The detector 50 may have the structure of FIG. 2. The switches 31 and 32 can be implemented with a switching means according to the present invention, and the detector 50 can be implemented with a power detection means according to the present invention. Further, the control circuit 70 can be implemented with a control means according to the present invention.

Figure 10:
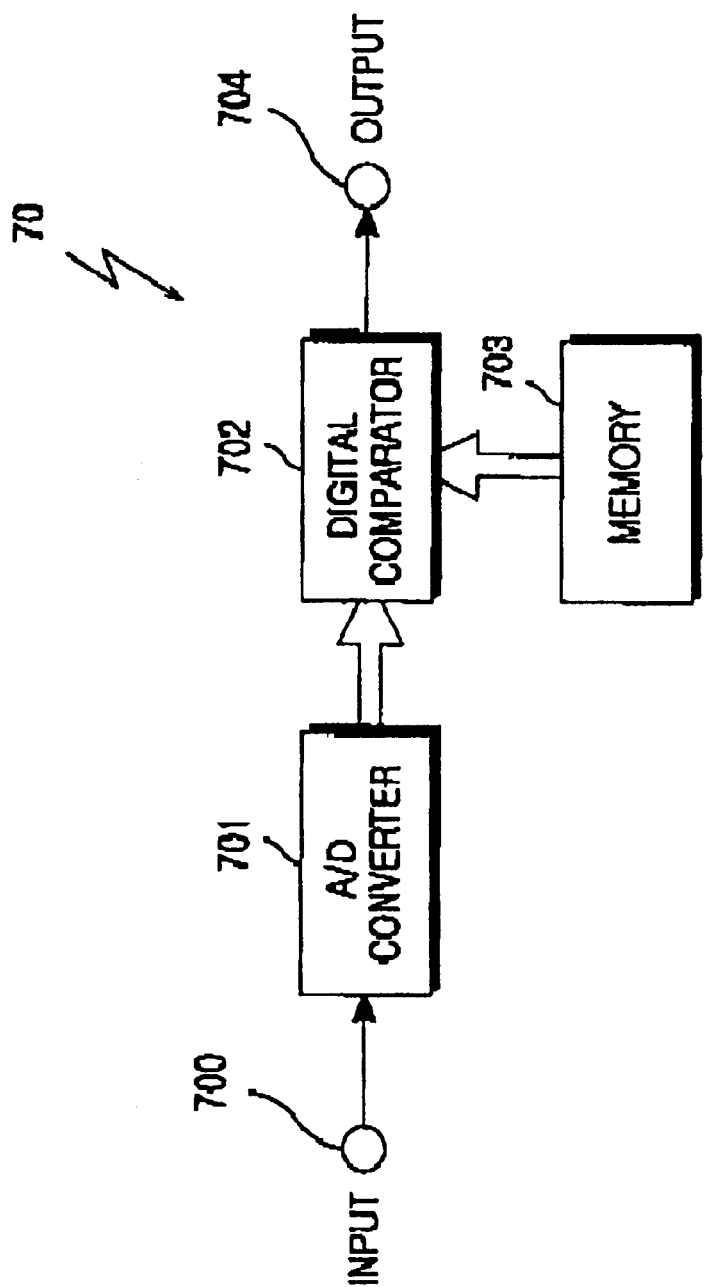
FIG. 10 illustrates a detailed structure of the control circuit of FIG. 9 according to an embodiment of the present invention.

FIG. 10 illustrates a detailed structure of the control circuit 70 of FIG. 9 according to an embodiment of the present invention. Referring to FIG. 10, the control circuit 70 includes an A/D converter 701 for A/D converting a DC component output from the detector 50, a digital comparator 702, and a memory 703. The memory 703 stores data of a reference power level used for determining an input power level. That is, the memory 703 stores data of the reference power level at a point where the input power-to-ACPR characteristic of the high-power amplifier 12 become worse during the non-linear distortion compensation control than during suspension of the non-linear distortion compensation control.

Figure 8:
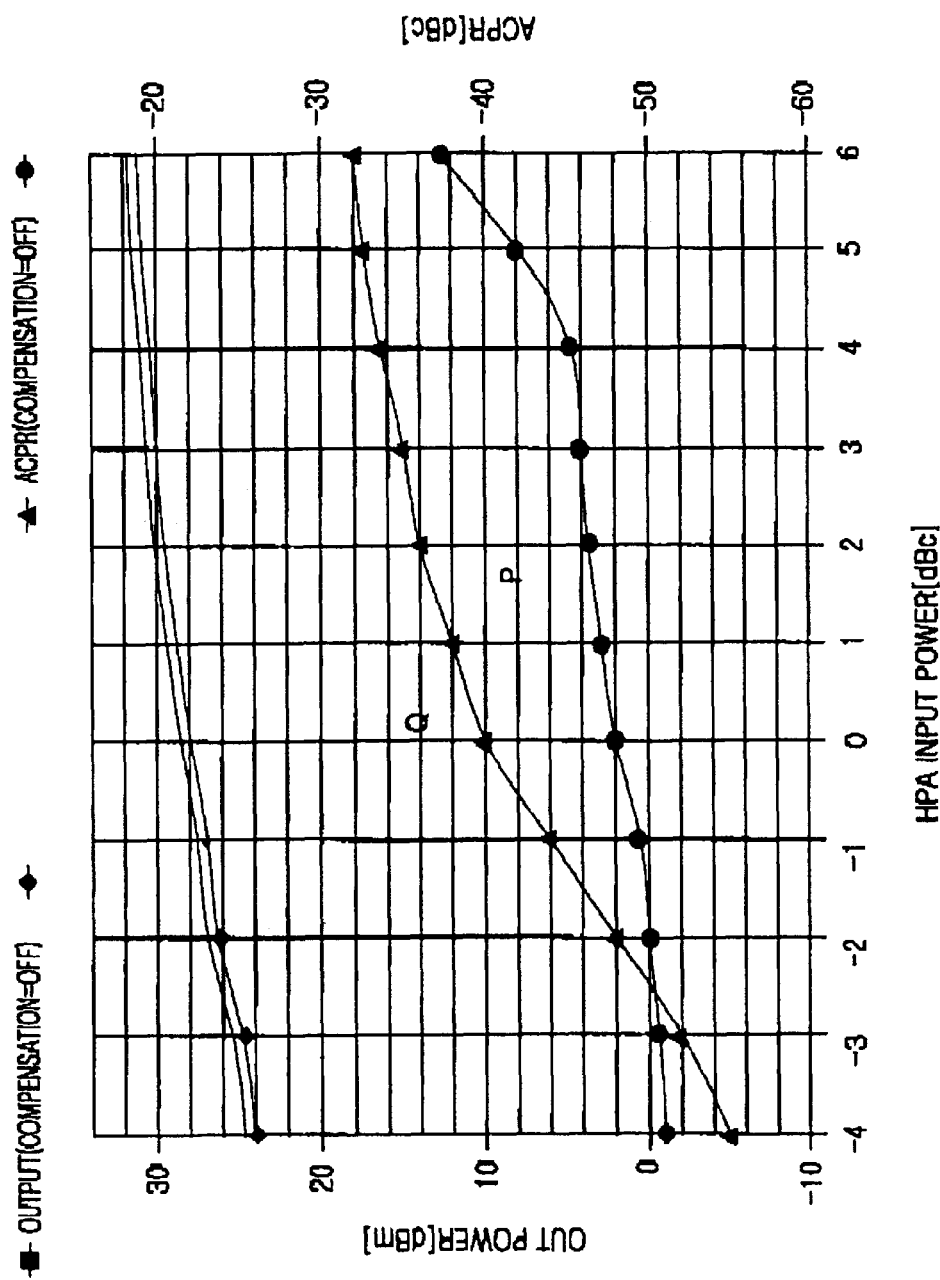
FIG. 8 illustrates an input power-to-ACPR characteristic of the high-power amplifier used in a transmitter.

The reference power level will be described with reference to FIG. 8. The reference power level is set to an input power level of the high-power amplifier 12 at an intersection point of a curve P representing an input power-to-ACPR characteristic of the high-power amplifier 12 during the non-linear distortion compensation control, and a curve Q representing an input power-to-ACPR characteristic of the high-power amplifier 12 during suspension of the non-linear distortion compensation control.

Turning back to FIG. 10, the control circuit 70 receives the output of the detector 50 through an input node 700. The A/D converter 701 A/D converts the output of the detector 50. The digital comparator 702 compares an output of the A/ID converter 701 with a reference power level value previously stored in the memory 703, and provides the switches 31 and 32 with a control signal for turning OFF the switches 31 and 32 through an output node 704, when the output level of the detector 50 is less than the reference power level. The detector 50 and the control circuit 50 are not restricted to the aforementioned structure, but can be implemented with another structure as long as it has the same function.

Figure 11:
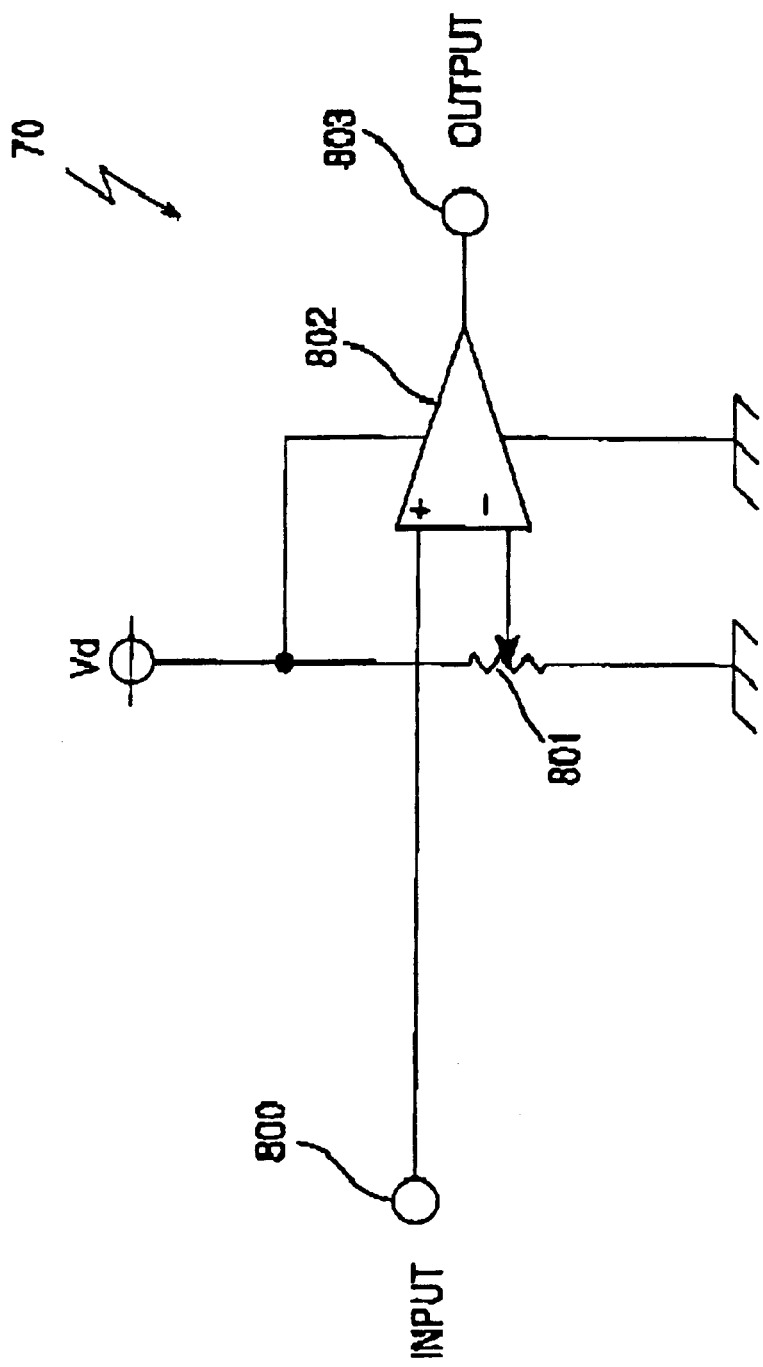
FIG. 11 illustrates a detailed structure of the control circuit of FIG. 9 according to another embodiment of the present invention.

FIG. 11 illustrates a detailed structure of the control circuit of FIG. 9 according to another embodiment of the present invention. Referring to FIG. 11, the control circuit 70 includes an operational amplifier 802 (an analog comparator) and a variable resistor 801 for generating a reference voltage. The operational amplifier 802 has a non-inverted input node connected to the output of the detector 50 through an input node 800, and an inverted input node connected to the variable resistor 801. The operational amplifier 802 compares an output of the comparator 50 with the reference voltage from the variable resistor 801, and provides the switches 31 and 32 with a control signal for turning OFF the switches 31 and 32 through an output node 803, when the output level of the detector 50 is less than the reference voltage.

Turning back to FIG. 9, the subtracters 16 and 17 subtract distortion components e and f from baseband signals I and Q, respectively, and then provide the subtracted signals to the quadrature modulator 11. Further, the quadrature modulator 11 is provided with a carrier signal g generated by the carrier generator 18. The $\pi/2$ phase shifter in the quadrature modulator 11 shifts a phase of the carrier signal g by $\pi/2$ and provides the phase-shifted carrier signal to the multiplier 112. The multiplier 112 then multiplies the $\pi/2$-phase-shifted carrier signal from the $\pi/2$ phase shifter 111 by a signal determined by subtracting the signal f from the baseband signal Q by the subtracter 17, and provides its output to the adder 114. At the same time, the multiplier 113 in the quadrature modulator 11 multiplies the carrier signal g from the carrier generator 18 by a signal determined by subtracting the signal e from the baseband signal I by the subtracter 16, and provides its output to the adder 114. The adder 114 then adds the output signal of the multiplier 112 and the output signal of the multiplier 113, thus outputting a quadrature-modulated signal i. The quadrature-modulated signal i is divided into two signals by the directional combiner/divider 19: one of the divided signals is provided to the high-power amplifier 12, while the other divided signal is provided to the directional combiner/divider 30. It is assumed herein that the input power level of the high-power amplifier 12 is higher than the reference power level stored in the memory 703. In this state, therefore, the switches 31 and 32 are turned ON. One divided signal output from the directional combiner/divider 30 is provided to the detector 50 and the other divided signal is provided to the delay circuit/phase shifter 20.

The high-power amplifier 12 non-linearly high-power amplifies the quadrature-modulated signal by a gain of K. An output signal j of the high-power amplifier 12 is divided again into two signals by the directional combiner/divider 21: one of the divided signals is provided as an output signal, while the other divided signal is provided to an attenuator 13. The attenuator 13 attenuates the signal by the gain of the high-power amplifier 12. An output signal k of the attenuator 13 is provided to the subtracter 14.

Meanwhile, the delay circuit/phase shifter 20 shifts the phase of the divided signal in order to match it to the phase of the output signal of the attenuator 13, and provides its output signal l to the subtracter 14. The subtracter 14 then subtracts the output signal l of the delay circuit/phase delay 20 from the output signal k of the attenuator 13. That is, the subtracter 14 subtracts the distortion-free quadrature-modulated signal l output through the directional combiner/dividers 19, 30 and the delay circuit/phase shifter 20, from the distortion component-included signal k output through the high-power amplifier 12, the directional combiner/divider 21 and the attenuator 13. By doing so, the subtracter 14 extracts only the non-linearly amplified distortion component a. The phase adjuster 22 adjusts a phase of the non-linearly amplified distortion component a, and provides the phase-adjusted signal to the multipliers 152 and 153 in the quadrature demodulator 15.

Further, the quadrature demodulator 15 receives the carrier signal g generated by the carrier generator 18. The multiplier 152 in the quadrature demodulator 15 multiplies the non-linear distortion component b output from the phase adjuster 22 by a carrier signal g and provides its output to the amplitude adjuster 23. Further, the $\pi/2$ phase shifter 151 in the quadrature demodulator 15 shifts a phase of the carrier signal g by $\pi/2$, and provides the phase-shifted carrier m to the multiplier 153. The multiplier 153 then multiplies the phase-shifted carrier m by the non-linear distortion component b output from the phase adjuster 22 and provides its output to the amplitude adjuster 24. In this manner, the non-linear distortion component b is subject to quadrature demodulation. The amplitude adjusters 23 and 24 adjust amplitude of the received signals and provide the amplitude-adjusted baseband distortion components e and f to the subtracters 16 and 17, respectively.

As a result, the subtracter 16 provides the baseband signal I overlapped with an inverse distortion component to the quadrature modulator 11 by previously subtracting the distortion component e caused by the amplification operation of the high-power amplifier 12 from the baseband signal I. Also, the subtracter 17 provides the quadrature modulator 11 with the baseband signal Q overlapped with the inverse distortion component by previously subtracting the distortion component f caused by the amplification operation of the high-power amplifier 12 from the baseband signal Q. That is, the subtracters 16 and 17 overlap the input baseband signals with the distortion components having an inverse baseband distortion characteristic caused by quadrature demodulation of the distortion components extracted by the subtracter 14, i.e., a characteristic of removing the non-linear distortion components generated during high-power amplification. Thus, it is possible to remove the non-linear distortion components generated during high-power amplification by the high-power amplifier 12 after quadrature-modulation of the inverse distortion component-overlapped baseband signals by the quadrature modulator 11.

The detector 50 receives the same quadrature-modulated signal as that provided to the high-power amplifier 12. Thus, the signal provided to the detector 50 is proportional to the input power level of the high-power amplifier 12. The detector 50 detects the received signal and generates a DC voltage, which is proportional to the output signal power of the directional combiner/divider 30, i.e., the input signal power of the high-power amplifier 12. The DC voltage is provided to the control circuit 70.

The control circuit 70 turns ON/OFF the switches 31 and 32 according to the input power level of the high-power amplifier 12. To be specific, the control circuit 70 turns OFF the switches 31 and 32, when the input power level of the high-power amplifier 12 drops below a reference power level at a point where the input power-to-ACPR characteristic of the high-power amplifier 12 becomes worse during non-linear distortion compensation control than during suspension of the non-linear distortion compensation control. As a result, the non-linear distortion compensation control function is automatically suspended, thus improving the input power-to-ACPR characteristic of the high-power amplifier 12.

Accordingly, the non-linear distortion compensation circuit according to the second embodiment of the present invention suspends an operation of overlapping the baseband signal with a phase-inverted distortion component of the baseband distortion component, when the input power level of the high-power amplifier 12 drops below the reference power level at a point where the input power-to-ACPR characteristic of the high-power amplifier 12 becomes worse during non-linear distortion compensation control than during suspension of the non-linear distortion compensation control. As a result, the non-linear distortion compensation circuit has an excellent ACPR characteristic over the whole input power level of the high-power amplifier.

Figure 12:
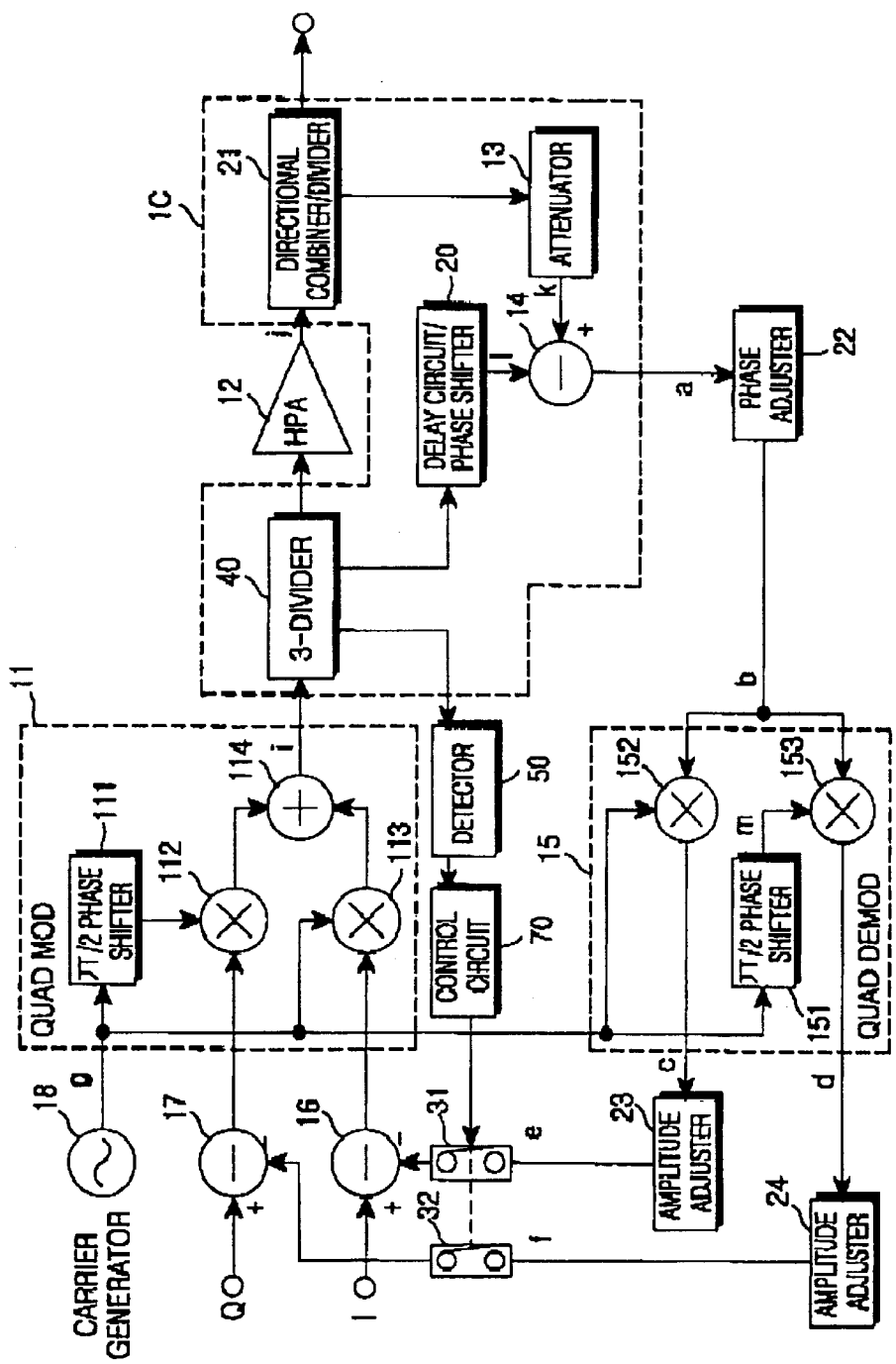
FIG. 12 illustrates a structure of a non-linear distortion compensation circuit according to a third embodiment of the present invention.

FIG. 12 illustrates a structure of a non-linear distortion compensation circuit according to a third embodiment of the present invention. Reference will be made the to differences between the non-linear distortion compensation circuit of FIG. 12 and the non-linear distortion compensation circuit of FIG. 9. The non-linear distortion compensation circuit includes a 3-divider 40 for dividing the output signal of the quadrature modulator 11 instead of the directional combiners/dividers 19 and 30 in FIG. 9. The divided signals from the 3-divider 40 are provided to the high-power amplifier 12, the delay circuit/phase shifter 20 and the detector 50, respectively. The other structure is identical to that of FIG. 9, so the detailed description will be avoided herein, for simplicity.

Figure 13:
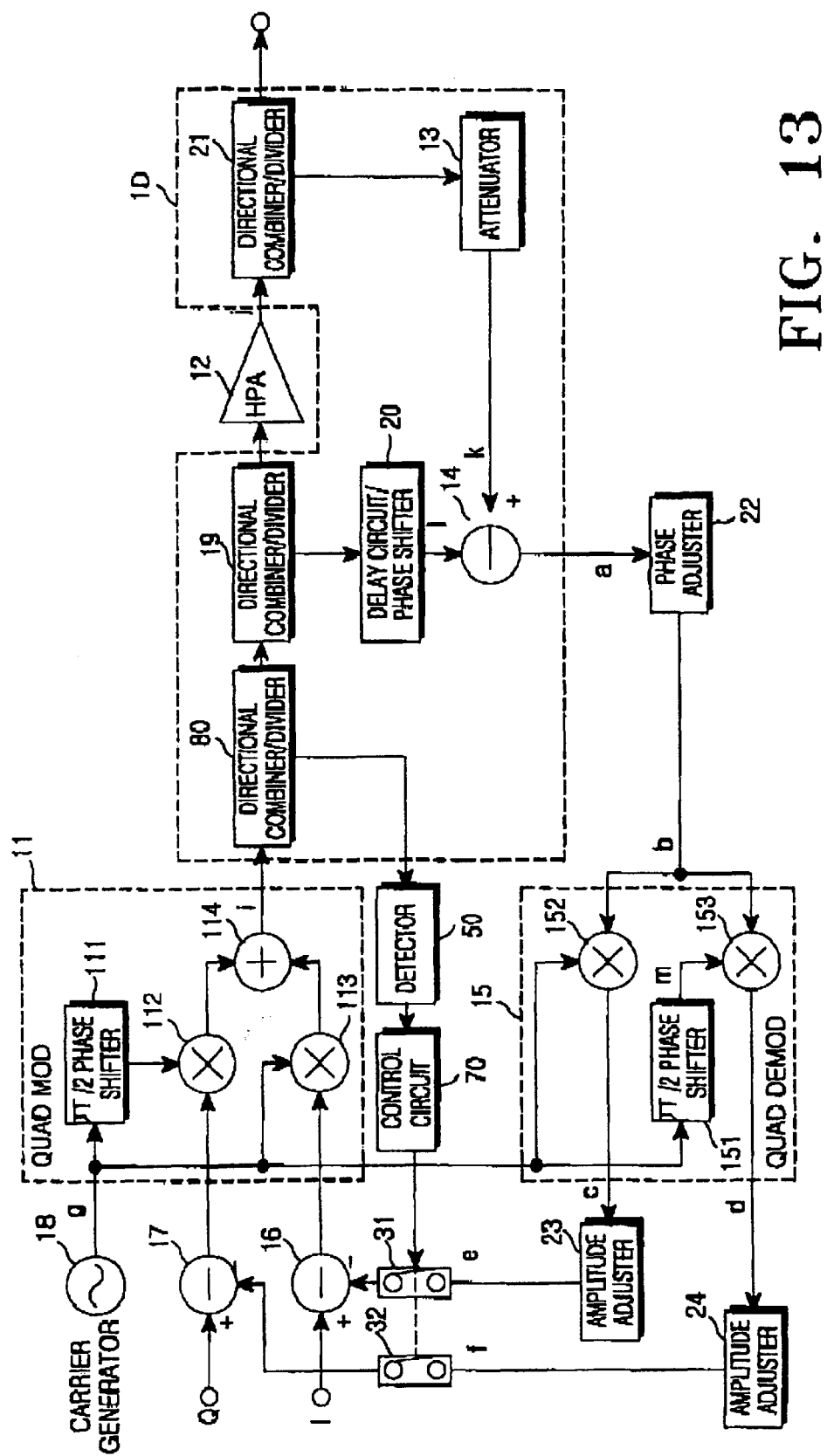
FIG. 13 illustrates a structure of a non-linear distortion compensation circuit according to a fourth embodiment of the present invention

FIG. 13 illustrates a structure of a non-linear distortion compensation circuit according to a fourth embodiment of the present invention. The differences between the non-linear distortion compensation circuit according to the fourth embodiment of the present invention and the non-linear distortion compensation circuit of FIG. 9 is as follows. The non-linear distortion compensation circuit includes directional combiners/dividers 19 and 80 instead of the directional combiners/dividers 19 and 30 in FIG. 9. The directional combiner/divider 80 divides the output signal of the quadrature modulator 11, and provides one divided signal to the detector 50 and the other divided signal to the directional combiner/divider 19. The directional combiner/divider 19 divides again the received signal into two signals, and provides one divided signal to the high-power amplifier 12 and the other divided signal to the delay circuit/phase shifter 20. In this way, the output signal of the quadrature modulator 11 is divided into three signals. The three divided signals are provided to the high-power amplifier 12, the delay circuit/phase shifter 20 and the detector 50, respectively. The other structure is identical to that of FIG. 9, so the detailed description will be avoided herein, for simplicity.

The non-linear distortion compensation circuits of FIGS. 12 and 13 have the same effects as the non-linear distortion compensation circuit of FIG. 9. The present invention has been described with reference to the embodiments in which the input signal of the high-power amplifier 12 is provided to the control circuit 70 after being subjected to detection. However, in an alternative embodiment, the output signal of the high-power amplifier 12 can be applied to the control circuit 70 after being subjected to detection. In addition, although the detector of FIG. 2 includes a half-wave rectifier, the half-wave rectifier may be replaced with a full-wave rectifier. Further, the lowpass filter in the detector of FIG. 2 may have a different structure.

The non-linear distortion compensation circuit according to the embodiments of the present invention includes switches for switching input signals in a feedback loop formed between the distortion extractor and the distortion overlapping section. Further, the non-linear distortion compensation circuit includes the detector (a power detection means) for detecting an input power level of the high-power amplifier for non-linearly amplifying the quadrature-modulated signal, and the control circuit (a control means) for controlling the switches. The control circuit turns OFF the switches, when the input signal power of the high-power amplifier drops below the reference power level at a point where the input power-to-ACPR characteristic of the high-power amplifier becomes worse during non-linear distortion compensation control than during suspension of the non-linear distortion compensation control. However, the present invention is not restricted to these embodiments.

For example, instead of using the switches for switching the feedback loop for feeding back the non-linear distortion component generated by the high-power amplifier, the non-linear distortion compensation circuit may include a control means for disabling one of a plurality of function elements included in the feedback loop formed between the distortion extractor and the distortion overlapping section, when the input signal power of the high-power amplifier drops below the reference power level at a point where the input power-to-ACPR characteristic of the high-power amplifier becomes worse during non-linear distortion compensation control than during suspension of the non-linear distortion compensation control.

As described above, the non-linear distortion compensation circuit according to the present invention automatically controls an attenuation of the attenuator such that the DC component is minimized, thus increasing the ACPR of the high-power amplifier. In addition, the non-linear distortion compensation circuit can increase the ACPR over the entire frequency band by selectively using the feedback circuit according to the output power level where the ACPR is decreased.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A method for compensating for non-linear distortion generated during non-linear high-power amplification in a transmitter after quadrature modulation, the transmitter having a distortion extractor for extracting a non-linear distortion component from a non-linearly high-power amplified modulated signal, a quadrature modulator for quadrature modulating the non-linear distortion component into a baseband distortion component after phase adjustment, and a distortion overlapping section for overlapping the baseband signal with a phase-inverted distortion component of the baseband distortion component, the method comprising the steps of:

attenuating an output signal of the high-power amplifier by a gain of the high-power amplifier when the high-power amplifier generates an amplified signal, and extracting a non-linear distortion component by subtracting a phase-adjusted input signal of the high-power amplifier from the attenuated output signal; and converting the non-linear distortion component into a DC (Direct Current) component, and automatically controlling an attenuation of the output signal of the high-power amplifier to minimize the DC component.

2. An apparatus for compensating for non-linear distortion generated during non-linear high-power amplification in a transmitter after quadrature modulation, the transmitter having a distortion extractor for extracting a non-linear distortion component from a non-linearly high-power amplified modulated signal, a quadrature modulator for quadrature modulating the non-linear distortion component into a baseband distortion component after phase adjustment, and a distortion overlapping section for overlapping the baseband signal with a phase-inverted distortion component of the baseband distortion component, the apparatus comprising:

a converter for converting the non-linear distortion component output from the distortion extractor into a DC component; and a controller for automatically controlling an attenuation of the output signal of the high-power amplifier to minimize the DC component output from the converter.

3. The apparatus as claimed in claim 2, wherein the distortion extractor comprises:

an attenuator for attenuating the output signal of the high-power amplifier by a gain equal to the gain of the high-power amplifier, when the high-power amplifier outputs an amplified signal;

a phase shifter for shifting a phase of an input signal of the high-power amplifier; and a subtracter for subtracting an output signal of the phase shifter from an output signal of the attenuator;

wherein the attenuator, under the control of the controller, automatically controls an attenuation of the output signal of the high-power amplifier to minimize the DC component output from the converter.

4. A method for compensating for non-linear distortion generated during non-linear high-power amplification in a transmitter after quadrature modulation, the transmitter having a distortion extractor for extracting a non-linear distortion component from a non-linearly high-power amplified modulated signal, a quadrature modulator for quadrature modulating the non-linear distortion component into a baseband distortion component after phase adjustment, and a distortion overlapping section for overlapping the baseband signal with a phase-inverted distortion component of the baseband distortion component, the method comprising the step of:

suspending an operation of overlapping the baseband signal with a phase-inverted distortion component of the baseband distortion component, when an input power level of the high-power amplifier drops below a power level at a point where an input power-to-ACPR characteristic of the high-power amplifier becomes worse during non-linear distortion compensation control than during suspension of the non-linear distortion compensation control.

5. An apparatus for compensating for non-linear distortion generated during non-linear high-power amplification in a transmitter after quadrature modulation, the transmitter having a distortion extractor for extracting a non-linear distortion component from a non-linearly high-power amplified modulated signal, a quadrature modulator for quadrature modulating the non-linear distortion component into a baseband distortion component after phase adjustment, and a distortion overlapping section for overlapping the baseband signal with a phase-inverted distortion component of the baseband distortion component, the apparatus comprising:

a switch for switching a signal input into said distortion overlapping section, said signal included in a feedback loop formed between the distortion extractor and the distortion overlapping section;

a power detector for detecting an input power level of the high-power amplifier;

a controller for receiving the signal detected by the power detector and turning OFF the switch when the input power level of the high-power amplifier drops below a power level at a point where an input power-to-ACPR characteristic of the high-power amplifier becomes worse during non-linear distortion compensation control than during suspension of the non-linear distortion compensation control.

6. An apparatus for compensating for non-linear distortion generated during non-linear high-power amplification in a transmitter after quadrature modulation, the transmitter having a distortion extractor for extracting a non-linear distortion component from a non-linearly high-power amplified modulated signal, a quadrature modulator for quadrature modulating the non-linear distortion component into a baseband distortion component after phase adjustment, and a distortion overlapping section for overlapping the baseband signal with a phase-inverted distortion component of the baseband distortion component, the apparatus comprising:

a power detector for detecting an input power level of the high-power amplifier; and a controller for receiving the signal detected by the power detector and disabling one of a plurality of function elements included in a feedback loop formed between the distortion extractor and the distortion overlapping section, when the input power level of the high-power amplifier drops below a power level at a point where an input power-to-ACPR characteristic of the high-power amplifier becomes worse during non-linear distortion compensation control than during suspension of the non-linear distortion compensation control.

* * * * *